| United States Patent [19] | [11] Patent Number: 4,892,894 |
|---|---|
| Koleske | [45] Date of Patent: Jan. 9, 1990 |

[54] PHOTOCOPOLYMERIZABLE COMPOSITIONS BASED ON EPOXY AND HYDROXYL-CONTAINING ORGANIC MATERIALS

[75] Inventor: Joseph V. Koleske, Charleston, W. Va.

[73] Assignee: Union Carbide Chemical and Plastics Company Inc., Danbury, Conn.

[21] Appl. No.: 191,749

[22] Filed: May 5, 1988

Related U.S. Application Data

[63] Continuation of Ser. No. 794,980, Nov. 7, 1985, abandoned, which is a continuation-in-part of Ser. No. 369,835, Apr. 19, 1982, abandoned.

[51] Int. Cl.$^4$ .............................................. C08G 59/62
[52] U.S. Cl. ...................................... 522/31; 522/170; 528/361
[58] Field of Search ................... 522/31, 170; 528/361

[56] References Cited

U.S. PATENT DOCUMENTS

| 4,058,401 | 11/1977 | Crivello | 96/115 R |
|---|---|---|---|
| 4,138,255 | 2/1979 | Crivello | 96/35.1 |
| 4,173,476 | 11/1979 | Smith et al. | 430/280 |
| 4,218,531 | 8/1980 | Carlson | 430/280 |
| 4,231,951 | 11/1980 | Smith et al. | 260/446 |
| 4,245,029 | 1/1981 | Crivello | 430/280 |
| 4,256,828 | 3/1981 | Smith | 430/280 |

*Primary Examiner*—Allan M. Lieberman
*Assistant Examiner*—A. H. Koeckert
*Attorney, Agent, or Firm*—Jean B. Mauro

[57] ABSTRACT

Described herein are photocopolymerizable compositions comprising a cycloaliphatic epoxide an alkylene oxide derived polyol having an average molecular weight of from about 2000 to about 4500 and a photoinitiator. These compositions are particularly suited for coating paper, wood, metal, and plastic substrates.

1 Claim, No Drawings

PHOTOCOPOLYMERIZABLE COMPOSITIONS BASED ON EPOXY AND HYDROXYL-CONTAINING ORGANIC MATERIALS

This application is a continuation of prior U.S. application Ser. No. 794,980 filed 11-07-85 which is a CIP of application No. 369,835 filed 4-19-82 both now abandoned.

This invention is directed to a photocopolymerizable composition comprising a cycloaliphatic epoxide, an alkylene oxide derived polyol having an average molecular weight of from about 2000 to about 4500 and a photoinitiator.

U.S. Pat. No. 4,256,828 describes photocopolymerizable compositions which contain epoxides, organic material with hydroxyl functionality and a photosensitive aromatic sulfonium or iodonium salt of a halogen-containing complex ion. The organic material with hydroxyl functionality is stated in said patent to include polymeric hydroxyl-containing materials such as polyoxypropylene glycols and triols of molecular weight from about 200 to about 10,000 corresponding to an equivalent weight of 100 to 5000 for the diols or 70 to 3300 for the triols. The examples which describe these glycol are Examples 8,15,16,45,46,49 and 50. However, these glycols have molecular weights of 1000 or less. The photocured compositions containing these glycols do not have the flexibility, toughness and impact strength which are acceptable in many end use applications.

U.S. Pat. No. 4,231,951 also describes photocopolymerizable compositions which contain cycloaliphatic epoxides, organic materials having a hydroxyl functionality of 2 and a triarylsulfonium complex salt photoinitiator. Specifically, Examples 25 to 35 describe compositions containing a cycloaliphatic epoxide, polyethyleneglycol 400 and particular photoinitators. However, here again the polyethyleneglycol has a very low molecular weight, i.e., about 400 and thus has the same deficiencies as those compositions described in U.S. Pat. No. 4,256,828.

THE INVENTION

It has now been found that the combination of a cycloaliphatic epoxide, an alkylene oxide derived polyol having an average molecular weight f from about 2000 to about 4500, and a photoinitiator results in photocopolymerizable compositions which when cured provide coatings which have high flexibility, toughness and impact strength. These compositions are particularly suited for coating paper, wood, metal and plastic substrates.

The compositions preferably include additives, such as oils and surfactants to achieve flow and leveling control, and/or low molecular weight alcohols, cellosolves, carbitols, diethyleneglycol to achieve viscosity reduction, and/or glycidyl-type epoxides, such as those prepared from bisphenol-A, epoxy novolaks, glycidyl ethers, and the like.

Suitable cycloaliphatic epoxides for purposes of this invention are those having an average of more than one vicinal epoxy group per molecule. The epoxy groups can be terminal epoxy groups or internal epoxy groups as exemplified by the cycloaliphatic epoxides which are subsequently described. Particularly desirable cycloaliphatic epoxides are the cyclohexane diepoxides, that is epoxides having at least one cyclohexane ring to which is attached at least one vicinal epoxy group.

Illustrative of suitable cycloaliphatic epoxides are the following:

FORMULA I

Diepoxides of cycloaliphatic esters of dicarboxylic acids having the formula:

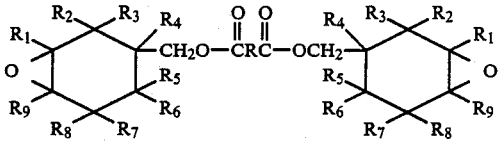

wherein $R_1$ through $R_9$, which can be the same or different are hydrogen or alkyl radicals generally containing one to nine carbon atoms inclusive and preferably containing one to three carbon atoms inclusive as for example methyl, ethyl, n-propyl, n-butyl, n-hexyl, 2-ethylhexyl, n-octyl, n-nonyl and the like; R is a valence bond or a divalent hydrocarbon radical generally containing one to ten carbon atoms inclusive and preferably containing four to six carbon atoms inclusive, as for example, alkylene radicals, such as trimethylene, tetramethylene, pentamethylene, hexamethylene, 2-ethylhexamethylene, octamethylene, nonamethylene, and the like; cycloaliphatic radicals, such as 1,4-cyclohexane, 1,3-cyclohexane, 1,2-cyclohexane, and the like.

Particularly desirable epoxides, falling within the scope of Formula I, are those wherein $R_1$ through $R_9$ are hydrogen and R is alkylene containing four to six carbon atoms.

Among specific diepoxides of cycloaliphatic esters of dicarboxylic acids are the following:
bis(3,4-epoxycyclohexylmethyl)oxalate,
bis(3,4-epoxycyclohexylmethyl)adipate,
bis(3,4-epoxy-6-methylcyclohexylmethyl)adipate,
bis(3,4-epoxycyclohexylmethyl)pimelate,
and the like. Other suitable compounds are described in U.S. Pat. No. 2,750,395 to B. Phillips et al.

FORMULA II

A 3,4-epoxycyclohexylmethyl-3,4-epoxycyclohexane carboxylate having the formula:

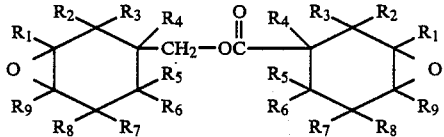

wherein $R_1$ through $R^9$ which can be the same or different are as defined for $R_1$ in formula I. Particularly desirable compounds are those wherein $R_1$ through $R_9$ are hydrogen.

Among specific compounds falling within the scope of Formula II are the following: 3,4-epoxycyclohexylmethyl, 3,4-epoxycyclohexanecarboxylate, 3,4-epoxy-1-methylcyclohexylmethyl, 3,4-epoxy-1-methylcyclohexanecarboxylate, 6-methyl-3,4-epoxycyclohexylmethyl, 6-methyl-3,4-epoxycyclohexanecarboxylate, 3,4-epoxy-3-methylcyclohexylethyl, 3,4-epoxy-3-methylcyclohexanecarboxylate, 3,4-epoxy-5-methylcyclohexylmethyl, 3,4-epoxy-5-methylcyclohexanecarboxylate. Other suitable compounds are described in U.S. Pat. No. 2,890,194 to B. Phillips et al.

FORMULA III

Diepoxides having the formula:

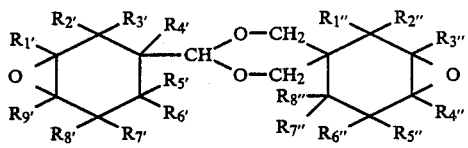

wherein the R single and double primes, which can be the same or different, are monovalent substituents such as hydrogen, halogen, i.e. chlorine, bromine, iodine or fluorine, or monovalent hydrocarbon radicals, or radicals as further defined in U.S. Pat. No. 3,318,822 to Hans Batzer et al. issued May 9, 1967.

Particularly desirable compounds are those wherein all the R's are hydrogen.

Other suitable cycloaliphatic epoxides are limonene diepoxide and the following:

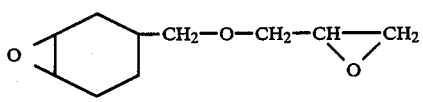

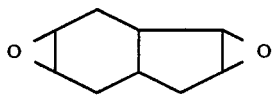

and the like.

The preferred cycloaliphatic epoxides are the following:
3,4-Epoxycyclohexylmethyl-3,4-Epoxy-cyclohexane caboxylate

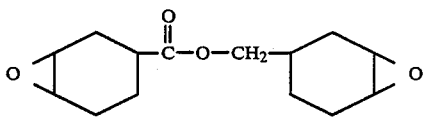

Bis-(3,4-Epoxycyclohexylmethyl)Adipate

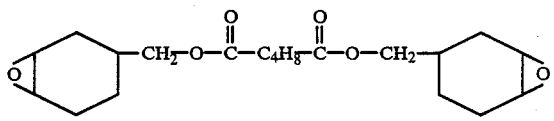

2-(3,4-Epoxycyclohexyl-5,5-spiro-3,4-epoxy)cyclohexane-meta-dioxane

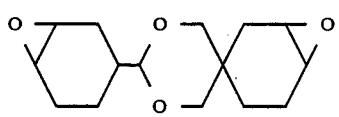

Vinyl cyclohexene dioxide

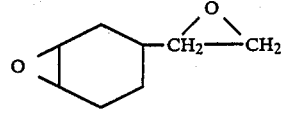

or mixture thereof.

Epoxides with six membered ring structures may also be used, such as diglycidyl esters of phthalic acid, partially hydrogenated phthalic acid or fully hydrogenated phthalic acid. Diglycidyl esters of hexahydrophthalic acids being preferred.

The alkylene oxide derived polyol suitable for use in this invention has an average molecular weight of from about 2000 to about 4500 of the formula:

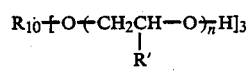

wherein $R_{10}$ is alkyl having 3 to 10 carbons, R' is H or methyl and n is an integer having values of about 10 to about 25, preferably from about 2500 to about 4200. The preferred alkylene oxide derived polyols are of the following formula:

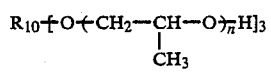

wherein $R_{10}$ is alkane of 3 to 10 carbon atoms, preferably 3 carbon atoms, and n is an integer of from about 10 to about 25.

Said polyols constitute from about 10 to about 60 weight percent of the photopolymerizable formulation.

The photoinitiator suitable for use herein may be any one of the well known photoinitiators such as described in, for example, U.S. Pat. Nos. 4,231,951; 4,256,828; 4,138,255 and 4,058,401, which patents are incorporated herein by reference. Preferred photoinitiators include triarylsulfonium complex salts as described in U.S. Pat. No. 4,231,951, aromatic sulfonium or iodonium salts of halogen-containing complex ions as described in U.S. Pat. No. 4,256,828; aromatic onium salts of Group VIa elements as described in U.S. Pat. Nos. 4,058,401 and 4,138,255. Such salts are commercially available as FC-508 and FC-509 (available from Minnesota Mining and Manufacturing Company), and as UVE-1014 (available from General Electric Company).

The photoinitiators are used in conventional amounts such as from about 0.1 to 30 parts by weight per 100 parts by weight of the combination of cycloaliphatic epoxide and the alkylene oxide derived polyol.

The compositions may preferably include additives such as oils, particularly silicone oil, surfactants such as silicone-alkylene oxide copolymers, silicone oil containing aliphatic epoxide groups, fluorocarbon surfactants; low molecular weight alcohols; cellosolves, such a butyl cellosolve; carbitols, such as butyl carbitol; diethyleneglycol; glycidyl ether monomers of the formula:

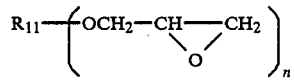

wherein $R_{11}$ is alkyl or aryl and n is an integer of 1 to 6. Examples are glycidyl ethers of polyhydric phenols obtained by reacting a polyhydric phenol with an excess of chlorohydrin such as epichlorohydrin. Further, examples of this type are described in, for example, U.S. Pat. No. 3,018,262; α-olefin epoxides; epoxy novolaks, and the like.

If desired, one may include in the photocopymerizable compositions various conventional non-basic fillers (e.g., silica, talc, glass bubbles, clays, powdered metal such as aluminum, zinc oxide, etc.) up to about 50% by volume or more, viscosity modifiers, rubbers, tackifying agents, pigments, and so forth.

The photocopymerizable compositions are particularly suitable in a variety of applications in the fields of protective coatings and graphic arts due to their superior impact resistance and abrasion-resistance and adhesion to rigid, resilient and flexible substrates such as metal, plastic, rubber, glass, paper, wood, and ceramics.

The photopolymerization of the compositions of the invention occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts of particular polymerizable materials and photoinitiator being utilized and depending upon the radiation source and distance from the source and the thickness of the coating to be cured. The compositions may also be polymerized by exposure to electron beam irradiation. Generally speaking the dosage necessary is from less than 1 megarad to 100 megarad or more.

The photocopymerizable compositions of this invention may be prepared simply by mixing the formulation ingredients together, preferably under "safe light" conditions when the photoinitiator is incorporated.

EXAMPLES

The following Examples serve to give specific illustration of the practice of this invention but they are not intended in any way to act to limit the scope of this invention.

The following designations used in the Examples have the following meaning:

Epoxy 1: 3,4-epoxycyclohexylmethyl-3,4-epoxycyclohexane carboxylate.
Polyol 1: a propylene oxide polyol prepared from propylene oxide and glycerol having a molecular weight of about 6000.
Polyol 2: same as Polyol 1 but having a molecular weight of about 5000.
Polyol 3: same as Polyol 1 but having a molecular weight of about 4200.
Polyol 4: same as Polyol 1 but having a molecular weight of about 3000.
Polyol 5: same as Polyol 1 but having a molecular weight of about 2500.
Polyol 6: same as Polyol 1 but having a molecular weight of about 1500.
Polyol 7: same as Polyol 1 but having a molecular weight of about 700.

Photoinitiator 1: FC-508, a solution of a triarylsulfonium hexafluorophosphate with a specific gravity of 1.33 and a Brookfield viscosity of 40,000 to 60,000 cps.
Photoinitiator 2: UVE-1014, a solution of a triarylsulfonium hexafluoroantimony salt with a specific gravity of 1.39 and a Brookfield viscosity of 74 cps.

The procedures used to test the cured coatings were as follows:

Acetone resistance—in this test a test specimen was rubbed with a cloth saturated with acetone. A rub back and forth over the test specimen with the cloth was referred to as a "double rub". A rating system for evaluating acetone resistance for a given number of double rubs was as follows:

| Value | Description |
| --- | --- |
| (1) | No change in coating appearance |
| (2) | Scratches surface |
| (3) | Dulled, marred, some coating removed |
| (4) | Breaks in film apparent |
| (5) | 50% of coating removed |

Pencil Hardness—ASTMD-3363-74

Crosshatch adhesion—refers to a test using 10 parallel, single-edge, razor blades to scribe test films with 2 sets of perpendicular lines in a crosshatch pattern. Ratings are based on the amount of film removed after applying and subsequently pulling a contact adhesive tape (Scotch Brand 606) away from the surface of a scribed coating at a 90 degree angle in a fast, rapid movement. It is important to carefully apply and press the tape to the scribed coating to eliminate air bubbles and provide a good bond because adhesion is reported as the percent of film remaining on the substrate with a 100 percent rating indicating complete adhesion of the film in the substrate.

Reverse or face impact resistance—measures the ability of a given film to resist rupture from a falling weight. A Gardner Impact Tester using an eight-pound dart is used to test the films cast and cured on the steel panel. The dart is raised to a given height in inches and dropped onto the reverse or face side of a coated metal panel. The inches times pounds, designated inch-pounds, absorbed by the film without rupturing is recorded as the reverse impact resistance of the film.

EXAMPLES AND CONTROLS

In these Examples and Controls, the type and amount of epoxide (grams), polyol (grams), and photoinitiator (grams) are shown in the Tables. Under "safe light" conditions the ingredients listed in the Tables were placed in brown, glass bottles and mixed by simple stirring to thoroughly blend the components. Any suitable, convenient means of blending the components can be used.

The formulated systems were coated onto the substrate, which was Bondenite 37 steel panels, with a wire-wond rod. The coatings varied from about 0.3 to about 1.1 mil in thickness. The coatings were cured with a medium pressure mercury lamp UV light source at 30 or 60 feet per minute with or without a post cure of 5 to 10 minutes at 150° to 170° C.

TABLE I

| | CONTROLS | | | | | | | |
|---|---|---|---|---|---|---|---|---|
| | 1 | 2 | 3 | 4 | 5 | 6 | 7 | 8 |
| Polyol 1 | 23.36 | 31.22 | — | — | — | — | — | — |
| Polyol 2 | — | — | 24.56 | 31.18 | — | — | — | — |
| Polyol 6 | — | — | — | — | 25.57 | 40.34 | 10.04 | 24.88 |
| Polyol 7 | — | — | — | — | — | — | — | — |
| Epoxide 1 | 72.14 | 64.28 | 70.94 | 64.32 | 69.93 | 55.16 | 85.46 | 70.62 |
| Photoinitiator 1 | 4.0 | 4.0 | 4.0 | 4.0 | 4.0 | 4.0 | 4.0 | 4.0 |
| Properties, No Post Cure | | | | | | | | |
| Acetone Resistance* | 15 (4) | 10 (4) | 100 (2) | 25 (4) | 30 (4) | 35 (5) | 27 (5) | 35 (5) |
| Pencil Hardness | 6B | 6B | 4B | 4B | F | F | 2H | 2H |
| % Crosshatch Adhesion | 100 | 100 | 70 | 50 | 100 | 100 | 100 | 100 |
| Gardner Impact, in lbs. | | | | | | | | |
| Face | 15 | 25 | 25 | ** | 25 | 25 | 25 | 25 |
| Reverse | <5 | <5 | <5 | ** | <5 | <5 | 5 | 5 |
| Properties, Post Cured 10 min at 170° C. | | | | | | | | |
| Acetone Resistance* | 20 (4) | 9 (5) | 30 (4) | 10 (4) | 70 (4) | 50 (4) | 75 (4) | 60 (4) |
| Pencil Hardness | 4B | <6B | <4B | <4B | 2H | 2H | 2H | 2H |
| % Crosshatch Adhesion | 100 | 100 | 100 | 90 | 100 | 100 | 100 | 100 |
| Gardner Impact, in lbs. | | | | | | | | |
| Face | ** | ** | ** | ** | 25 | 25 | 15 | 15 |
| Reverse | ** | ** | ** | ** | <5 | <5 | 5 | 5 |

*The first number listed represents the number of double rubs to obtain the rating values listed in parenthesis. The description of the value is given above.
**Considered too poor in quality to test, particularly because of the soft nature and poor acetone resistance of the coatings.

TABLE II

| | EXAMPLES | | | | | | | |
|---|---|---|---|---|---|---|---|---|
| | 1 | 2 | 3 | 4 | 5 | 6 | 7 | 8 |
| Polyol 3 | 24.07 | 32.06 | 24.07 | 32.06 | — | — | — | — |
| Polyol 4 | — | — | — | — | 25.04 | 30.71 | — | — |
| Polyol 5 | — | — | — | — | — | — | 22.35 | 36.22 |
| Epoxide | 71.43 | 63.44 | 71.43 | 63.44 | 70.46 | 64.79 | 73.15 | 59.28 |
| Photoinitiator 1 | 4.0 | 4.00 | — | — | 4.0 | 4.0 | — | — |
| Photoinitiator 2 | — | — | 4.0 | 4.0 | — | — | 4.0 | 4.0 |
| Properties, no Post Cure | | | | | | | | |
| Acetone Resistance* | 25(4) | 15(4) | 100(1) | 90(4) | 50(4) | 35(4) | 100(1) | 100(1) |
| Pencil Hardness | 2B | 5B | H | H | HB | HB | F | 2H |
| % Crosshatch Adhesion | 100 | 100 | 100 | 100 | 100 | 100 | 100 | 100 |
| Gardner Impact, in lbs. | | | | | | | | |
| Face | 320 | ** | 275 | >320 | >320 | >320 | 150 | >320 |
| Reverse | 320 | ** | 275 | >320 | >320 | >320 | 75 | >320 |
| Properties, Post Curred 10 min., 170° C. | | | | | | | | |
| Acetone Resistance | 20(5) | 7(5) | 100(1) | 100(1) | 100(2) | 100(3) | 100(1) | 100(1) |
| Pencil Hardness | 2B | 2B | 2H | H | H | HB | 2H | 2H |
| % Crosshatch Adhesion | 100 | 100 | 100 | 100 | 100 | 100 | 100 | 100 |
| Gardner Impact, in lbs. | | | | | | | | |
| Face | 25 | 25 | >320 | >320 | >320 | >320 | 150 | >320 |
| Reverse | 5 | 5 | >320 | >320 | >320 | >320 | 100 | >320 |

*The first number listed represents the number of double acetone rubs to obtain the rating value listed in parenthesis. The description of the value is given above.
**Not tested because of soft nature of coating.

TABLE III

| | 9 | 10 | 11 | 12 | 13 | 14 | 15 | 16* | 17 | 18 |
|---|---|---|---|---|---|---|---|---|---|---|
| Polyol 3 | 27.50 | 27.50 | 38.45 | 48.01 | — | — | — | — | — | — |
| Polyol 4 | — | — | — | — | 18.3 | 21.15 | 39.68 | — | — | — |
| Polyol 5 | — | — | — | — | — | — | — | 18.75 | 27.64 | 52.52 |
| Epoxide 1 | 68.00 | 68.00 | 57.05 | 47.49 | 77.2 | 74.35 | 55.82 | 76.75 | 67.86 | 42.98 |
| Photoinitiator 1 | 4.0 | — | — | — | 4.0 | 4.0 | 4.0 | — | — | — |
| Photoinitiator 2 | — | 4.0 | 4.0 | 4.0 | — | — | — | 4.0 | 4.0 | 4.0 |
| Properties, No Post Cure | | | | | | | | | | |
| Acetone Resistance** | 24(4) | 100(1) | 65(4) | 31(4) | 40(4) | 40(4) | 14(5) | 100(1) | 100(1) | 70(4) |
| Pencil Hardness | 2B | H | HB | 5B | F | F | 4B | 3H | 2H | HB |
| % Crosshatch Adhesion | 100 | 100 | 100 | 100 | 100 | 100 | 100 | 100 | 100 | 100 |
| Gardner Impact, in. lbs. | | | | | | | | | | |
| Face | 320 | 320 | 320 | 320 | 320 | 320 | 320 | 100 | 275 | 320 |
| Reverse | 320 | 320 | 320 | 320 | 320 | 320 | 320 | 15 | 250 | 320 |

TABLE III-continued

|  | 9 | 10 | 11 | 12 | 13 | 14 | 15 | 16* | 17 | 18 |
|---|---|---|---|---|---|---|---|---|---|---|
| Properties, Post Cured 10 min., 170° C. | | | | | | | | | | |
| Acetone Resistance** | 10(5) | 100(1) | 100(1) | 50(4) | 100(3) | 100(3) | 24(5) | 100(1) | 100(1) | 100(1) |
| Pencil Hardness | 2B | 2H | 3B | 5B | H | H | HB | 3H | 2H | HB |
| % Crosshatch Adhesion | 100 | 100 | 100 | 100 | 100 | 100 | 100 | 100 | 100 | 100 |
| Gardner Impact, in. lbs. | | | | | | | | | | |
| Face | 25 | 320 | 320 | 320 | 75 | 100 | 320 | 125 | 320 | 320 |
| Reverse | 5 | 320 | 320 | 320 | 25 | 25 | 320 | 5 | 320 | 320 |

*The coating formulation of Example 16 was also coated onto cold-rolled steel and galvanized steel. When the formulation was UV cured as described above, the resulting coatings without a post cure had an acetone resistance rating of 100(1) on both substrates; pencil hardness of F on cold-rolled steel and of 3 H on galvanized steel; and no crosshatch adhesion to cold-rolled steel and 100% adhesion to galvanized steel. When the coatings were post cured 10 minutes at 170° C., they had an acetone rating of 100(1), pencil hardness of 3 H, and 100% crosshatch adhesion to both substrates.

**The first number listed represents the number of double acetone rubs to obtain the rating values listed in parenthesis. The description of the value is given above.

TABLE IV

|  | 19 | 20 | 21 |
|---|---|---|---|
| Polyol 4 | 24.25 | 23.73 | 23.20 |
| Epoxide 1 | 68.25 | 66.77 | 65.30 |
| Photoinitiator 1 | 4.0 | 4.0 | 4.0 |
| Butyl Cellosolve | 3.0 | 5.0 | 7.0 |
| Properties, No Post Cure | | | |
| Acetone Resistance* | 60(4) | 85(4) | 55(5) |
| Pencil Hardness | F | F | HB |
| % Crosshatch Adhesion | 100 | 100 | 100 |
| Gardner Impact, in lbs. | | | |
| Face | 250 | 320 | 275 |
| Reverse | 200 | 320 | 100 |
| Properties, Post Cured 10 min., 170° C. | | | |
| Acetone Resistance* | 100(1) | 100(1) | 100(1) |
| Pencil Hardness | F | H | F |
| % Crosshatch Adhesion | 100 | 100 | 100 |
| Gardner Impact | | | |
| Face | 320 | 320 | 320 |
| Reverse | 320 | 320 | 320 |

*The first number listed represents the number of double rubs to obtain the rating value listed in parenthesis. The description of the value is given above.

EXAMPLE 19

For comparative purposes, the following mixtures were prepared by placing the indicated ingredients in glass bottles and well mixing them. They were then coated onto Bonderite 37 steel panels with a #20 wirewound rod and then cured with a Fusion Systems 300 watt/inch ultraviolet light source at 10 feet per minute. Formulation I is a repetition of Example 14 of U.S. Pat. No. 4,256,828. Formulation 2 is based on the instant invention.

|  | Formulation | |
|---|---|---|
|  | 1 | 2 |
| Epon 828 | 10.0 | — |
| ERL-4221 | — | 10.0 |
| Polymeg 2000 | 4.0 | — |
| LHT-67 | — | 4.0 |
| FC-508 | 0.42 | 0.42 |
| L-5410 | 0.07 | 0.07 |

Epon 828 is an epoxide that is known as the diglycidyl ether of Bisphenol A. This epoxide was used by Smith, U.S. 4,256,828 in Example 14. It is not a cycloaliphatic epoxide.

ERL-4221 is Epoxy 1 of the instant invention. Chemically it is 3,4-epoxycyclohexyl-methyl-3,4-epoxycyclohexane carboxylate.

LHT-67 is Polyol 5. It is a propylene oxide polyol prepared from propylene oxide and glycerol having a molecular weight of about 2500.

FC-508 is Photoinitiator 1.

Polymeg 2000 is a commercial polytetramethylene oxide polyol marked by Quaker Chemical. It was used in Smith, U.S. Pat. No. 4,256,828 in Example 14.

L-5410 is a polyalkyleneoxide modified dimethylpolysiloxane copolymeric surfactant that was used to improve flow and leveling.

After exposure to the ultraviolet light source, the resulting coating from Formulation 1 was sticky and tacky and could not be stacked, handled, etc. This coating was still tacky four days after UV exposure. It should be pointed out that this tack was less four days after exposure than immediately after cure, but there was definite tack or stickiness present in the "cured" coating. It is known to those skilled in the art of UV curing with cationic photoinitiators that cure continues after exposure to ultraviolet light—thus, one would expect these coatings to cure further as they age under ambient conditions. In contrast, the coating from Formulation 2 cured to give a tack-free coating with good hardness so that it could be easily handled, stacked, etc., when warm immediately after UV exposure.

Thus, it is readily apparent that there is a marked difference in the performance characteristics of the coating prepared in the manner described by Smith and the manner described in Formulation 2. Further, this demonstrates that the coatings of the instant application are a definite improvement over the state of the art as exemplified by Smith.

EXAMPLE 20

For comparative purposes, the following mixtures were prepared by placing the indicated ingredients in glass bottles and mixing them well. They were then coated onto Bonderite 37 steel panels with a #20 wirewound rod and then cured with a Fusion Systems 300 watt/inch ultraviolet light source at 10 feet per minute.

Formulation 1 is a repetition of Example 16 of U.S. Pat. No. 4,256,828.

Formulation 2 is based on the instant invention.

|  | Formulation | |
|---|---|---|
|  | 1 | 2 |
| D.E.R. 331 | 10.0 | — |
| ERL-4221 | — | 10.0 |
| Polymeg 2000 | 4.0 | — |
| LHT-67 | — | 4.0 |
| FC-508 | 0.50 | 0.50 |
| L-5410 | 0.07 | 0.07 |

After exposure to the ultraviolet light source, the coating from Formulation 1 was sticky and tacky immediately after exposure to the ultraviolet light source remained tacky for more than ten minutes after exposure. (The experiment was terminated after this period of time had elapsed.) In contrast, the coating from our application—Formulation 2—cured to give a tack-free coating with good hardness so that it could be easily handled, stacked, etc., when warm immediately after UV exposure. Thus these data indicate that there is a marked difference in the cure characteristics of the coating prepared in the manner described by Smith and the manner described in the present invention.

What is claimed is:

1. A photocopolymerizable composition comprising 3,4-epoxy-cyclohexylmethyl-3,4-epoxycyclohexane carboxylate, a triarylsulfonium salt photoinitiator and a propylene oxide glycerol polyol having a molecular weight of about 2,500 to 4,200, said polyol being present in said composition in an amount of about 10 to about 60 weight percent of the photopolymerizable constituents.

* * * * *